(12) United States Patent
Motoyama (10) Patent No.: US 7,058,375 B2
(45) Date of Patent: Jun. 6, 2006

(54) LOW NOISE BLOCK DOWN-CONVERTER HAVING TEMPERATURE CHARACTERISTIC COMPENSATING CIRCUIT

(75) Inventor: Koji Motoyama, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 528 days.

(21) Appl. No.: 09/960,654

(22) Filed: Sep. 24, 2001

(65) Prior Publication Data

US 2002/0061728 A1  May 23, 2002

(30) Foreign Application Priority Data

Oct. 10, 2000  (JP)  ............................. 2000-308655

(51) Int. Cl.
 *H03D 7/16*  (2006.01)
(52) U.S. Cl. .................... 455/131; 455/144; 455/150.1
(58) Field of Classification Search ................ 455/131, 455/144, 150.1, 193.1–193.3, 194.2, 195.1, 455/313–314, 340; 348/725, 731, 733; 327/512–513, 327/104; 330/296
See application file for complete search history.

(56) References Cited

U.S. PATENT DOCUMENTS

| | | | | |
|---|---|---|---|---|
| 3,701,910 A | * | 10/1972 | Sato | 327/484 |
| 4,163,908 A | * | 8/1979 | Price | 327/540 |
| 4,504,798 A | * | 3/1985 | Sasaki | 330/296 |
| 4,523,105 A | * | 6/1985 | Jose et al. | 327/104 |
| 4,792,987 A | * | 12/1988 | Tumeo | 455/131 |
| 5,361,043 A | * | 11/1994 | Shimotashiro et al. | 330/302 |
| 5,578,956 A | * | 11/1996 | Rossi et al. | 327/309 |
| 6,054,898 A | * | 4/2000 | Okuma et al. | 330/266 |
| 6,407,615 B1 | * | 6/2002 | Main et al. | 327/513 |
| 6,594,477 B1 | * | 7/2003 | Kitaguchi | 455/314 |

FOREIGN PATENT DOCUMENTS

| | | |
|---|---|---|
| CN | 1195224 A | 10/1998 |
| DE | 197 42 954 | 2/1999 |
| EP | 0 853 378 | 7/1998 |
| EP | 0 854 568 | 7/1998 |
| EP | 853378 A2 * | 7/1998 |
| JP | 64-47716 | 3/1989 |
| JP | 01160186 A * | 6/1989 |
| JP | 01-309506 | 12/1989 |
| JP | 9-270647 | 10/1997 |
| JP | 11-103215 | 4/1999 |
| JP | 2000-244247 | 9/2000 |

* cited by examiner

*Primary Examiner*—Melur Ramakrishnaiah
(74) *Attorney, Agent, or Firm*—Nixon & Vanderhye, P.C.

(57) ABSTRACT

In a mixer of a converter, a bipolar transistor is connected between the base of a bipolar transistor and a positive power-supply node within a driving circuit, as a temperature characteristic compensating circuit. When the ambient temperature of the driving circuit rises, collector current of the transistor is increased due to the temperature characteristic of the transistor. This lowers the drain voltage of a high electron mobility transistor. However, collector current of the transistor within the temperature characteristic compensating circuit is also increased, increasing the voltage at a point, so that the increase in the collector current of the transistor is suppressed. This results in a stabilized drain voltage of the transistor. Therefore, the low noise down-converter can supply a stable voltage to a transistor performing frequency conversion, without any effect from the change in the ambient temperature.

6 Claims, 9 Drawing Sheets

LOW NOISE BLOCK DOWN-CONVERTER HAVING TEMPERATURE CHARACTERISTIC COMPENSATING CIRCUIT

BACKGROUND OF THE INVENTION

1. Field of the Invention

The present invention relates to a Low Noise Block down-converter (hereinafter referred to as LNB), and more particularly, to an LNB in a satellite broadcast receiving system.

2. Description of the Background Art

In the satellite broadcast receiving system, an LNB has a function of amplifying, with low noise, a satellite broadcast wave signal in a 12 GHz band received from a broadcast satellite, and also frequency-converting the signal to be in an intermediate frequency (IF) band. The frequency conversion described above is performed in a mixer (hereinafter referred to as MIX) within the LNB.

Figure 9:
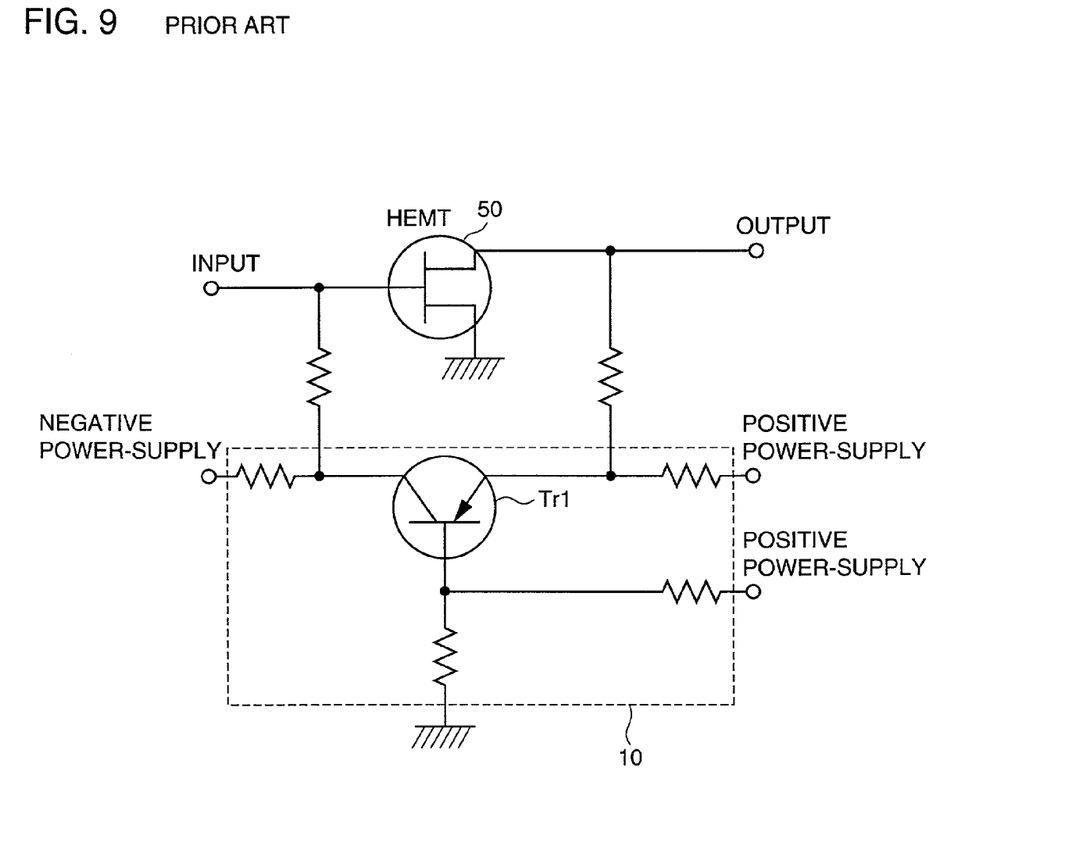
FIG. 9 is a circuit diagram showing the configuration of the conventional MIX.

FIG. 9 is a circuit diagram of an MIX. The MIX circuit includes a high electron mobility transistor (hereinafter referred to as HEMT) 50 used as a transistor for actually performing frequency conversion, and a driving circuit 10. Driving circuit 10 includes a PNP bipolar transistor Tr1 and a plurality of resistance elements.

Driving circuit 10 supplies a constant voltage to the drain of HEMT 50, and the constant voltage allows the MIX to perform stable frequency conversion. That is, characteristics of the MIX largely depend on the drain voltage of HEMT 50.

However, in the MIX, when an ambient temperature of PNP bipolar transistor Tr1 within driving circuit 10 is changed, the temperature characteristic of PNP bipolar transistor Tr1 itself causes a change in the voltage supplied to the drain of HEMT 50. The change in the drain voltage causes a change in the gain frequency characteristic of HEMT 50, interfering stable frequency conversion.

SUMMARY OF THE INVENTION

An object of the present invention is to provide a low noise down-converter including a driving circuit that can supply a stable voltage to a transistor performing frequency conversion, without any effect of a change in an ambient temperature.

According to an aspect of the present invention, a low noise down-converter for satellite broadcast receiving includes a mixer converting a received high-frequency signal into an intermediate-frequency signal. The mixer includes a transistor performing frequency conversion, a first bipolar transistor having an emitter connected to a drain of the transistor and a collector connected to a gate of the transistor, and a temperature characteristic compensating circuit connected to a base of the first bipolar transistor and canceling a temperature characteristic of the first bipolar transistor.

Thus, the temperature characteristic compensating circuit cancels the temperature characteristic of the first bipolar transistor, allowing the first bipolar transistor to supply a stable voltage to the drain of the transistor performing frequency conversion even in a case where the ambient temperature of the first bipolar transistor is changed.

Preferably, the temperature characteristic compensating circuit includes a second bipolar transistor having a conductive terminal connected to the base of the first bipolar transistor.

Thus, the second bipolar transistor stabilizes collector current of the first bipolar transistor with respect to a change in the ambient temperature, and as a result, the first bipolar transistor can supply a stable voltage to the drain of the transistor performing frequency conversion.

More preferably, the first and second bipolar transistors are packaged into a dual transistor.

Thus, the first bipolar transistor and the second bipolar transistor are packaged together, so that both of them operate under the same temperature condition. As a result, more stable voltage can be supplied to the drain of the transistor performing frequency conversion. Moreover, the area occupied by the transistors within the circuit can be smaller by collecting two transistors together into a single package.

As described above, according to the present invention, in the MIX within the LNB, installation of a temperature characteristic compensating circuit in a driving circuit allows a stable voltage to be supplied to a transistor performing frequency conversion, without any effect of a change in the ambient temperature.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described below in detail with reference to the drawings. It is noted that the same or corresponding portions are denoted by the same reference characters, and the description thereof will not be repeated.

First Embodiment

Figure 1:
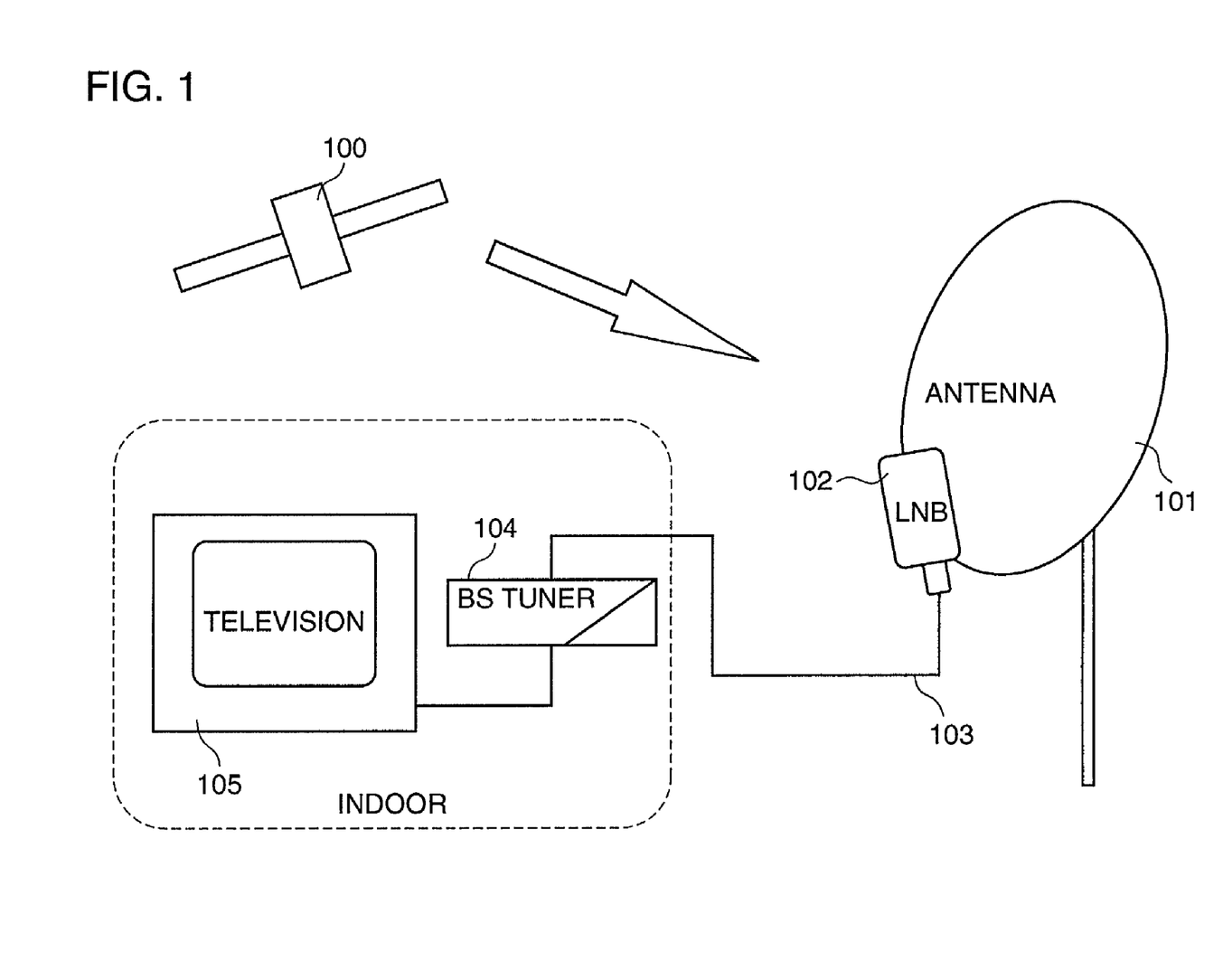
FIG. 1 shows the schematic configuration of a satellite broadcast receiving system.

FIG. 1 shows a typical satellite broadcast receiving system. The satellite broadcast receiving system includes an antenna 101, an LNB 102, a BS-IF cable 103, a BS tuner 104, and a television 105.

An uplink signal of 14 GHz sent out from a ground station is received by a broadcast satellite 100. Broadcast satellite 100 converts and amplifies the uplink signal to be in the 12 GHz band, and transmits the signal again toward the ground as a satellite broadcast wave signal. The satellite broadcast wave signal is received by antenna 101 and is input into LNB 102. LNB 102 amplifies, with low noise, the satellite broadcast wave signal which is a weak electric wave having a frequency in the 12 GHz band, and thereafter frequency-converts the signal into a signal in an intermediate frequency band (hereinafter referred to as a BS-IF signal) at an MIX which is an internal circuit. The BS-IF signal is transmitted to BS tuner 104 via BS-IF cable 103. At BS tuner 104, after a user selects the channel of a desired problem, the signal is FM-demodulated to reproduce a video signal and an aural signal. The reproduced video and aural signals are transmitted to television 105.

Figure 2:
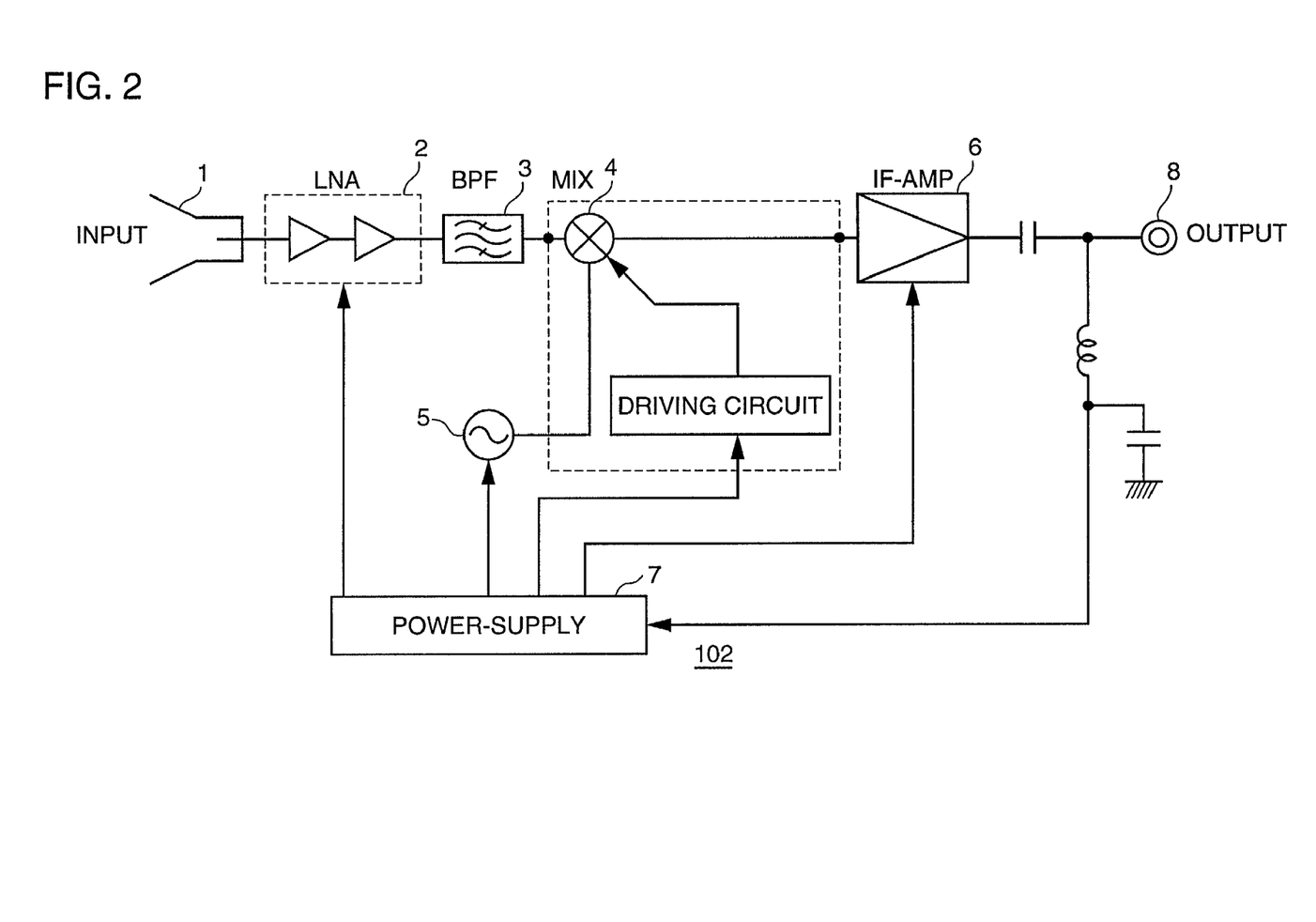
FIG. 2 is a block diagram showing the schematic configuration of an LNB in FIG. 1.

Next, the internal structure of LNB 102 will be described.

FIG. 2 is a circuit block diagram of LNB 102.

LNB 102 is includes a circular waveguide 1 receiving a satellite broadcast wave signal; a Low Noise Amplifier (hereinafter referred to as LNA) 2 amplifying the satellite broadcast wave signal with low noise; a BPF (Band Pass Filter) 3 passing a signal in a desired frequency band and rejecting a signal in an image frequency band; an MIX 4; a local oscillator 5 supplying an oscillation signal to MIX 4; an intermediate frequency amplifier (hereinafter referred to as IF-AMP) 6 amplifying a signal to be transmitted to BS tuner 104; a power-supply unit 7; and an output terminal 8.

A satellite broadcast wave signal having a frequency between 11.71 and 12.01 GHz is received by an antenna probe within waveguide 1. Subsequently, the satellite broadcast wave signal is input into LNA 2, and is amplified with low noise. The amplified signal in the 12 GHz band is input into BPF 3, and the signal in the image frequency band is rejected therefrom.

The satellite broadcast signal passed through BPF 3 is input into MIX 4. An oscillation signal of 10.678 GHz from local oscillator 5 is supplied to MIX 4. In MIX 4, the satellite broadcast signal in the 12 GHz band is frequency-converted into a BS-IF signal between 1035 and 1335 MHz.

Subsequently, the BS-IF signal is input into IF-AMP 6, where the signal is amplified to have appropriate noise characteristic and gain characteristic. The amplified BS-IF signal is output from output terminal 8, and is transmitted to BS tuner 104 via BS-IF cable 103.

Figure 3:
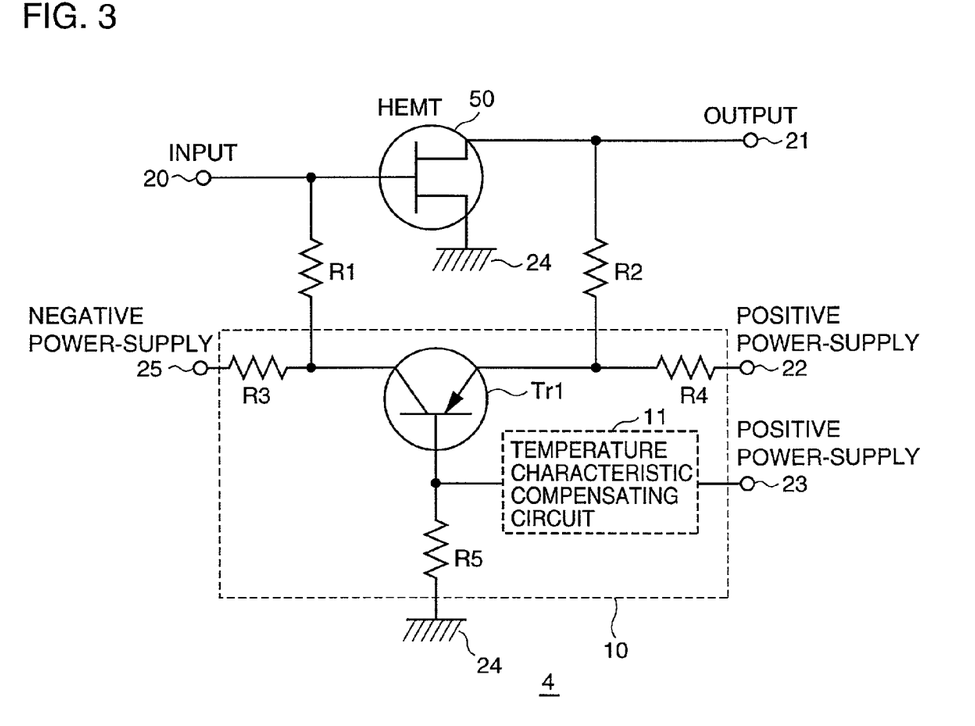
FIG. 3 is a circuit diagram showing the configuration of an MIX in FIG. 2 according to an embodiment of the present invention.

Next, MIX 4 within LNB 102 will be described.

FIG. 3 is a circuit diagram showing the configuration of MIX 4 according to an embodiment of the present invention.

MIX 4 includes an input terminal 20, an output terminal 21, an HEMT 50 frequency-converting an input satellite broadcast wave signal, resistance elements R1, R2, and a driving circuit 10.

Driving circuit 10 includes a PNP transistor Tr1 supplying a stable drain voltage to HEMT 50, a temperature characteristic compensating circuit 11 canceling the temperature characteristic of transistor Tr1, and resistance elements R3, R4, R5.

Resistance element R1 is connected between the gate of HEMT 50 and the collector of transistor Tr1. Resistance element R2 is connected between the drain of HEMT 50 and the emitter of transistor Tr1. Resistance element R3 is connected between a negative power-supply node and the collector of transistor Tr1. Moreover, resistance element R4 is connected between a positive power-supply node 22 and the emitter of transistor Tr1. Resistance element R5 is connected between the base of transistor Tr1 and a ground node 24. Temperature characteristic compensating circuit 11 is connected between a positive power-supply node 23 and the base of transistor Tr1. Furthermore, the source of HEMT 50 is connected to ground node 24.

HEMT 50 frequency-converts a satellite broadcast signal input from input terminal 20 into the gate of HEMT 50, using a local oscillation signal input from local oscillator 5 into the drain of HEMT 50.

Figure 4:
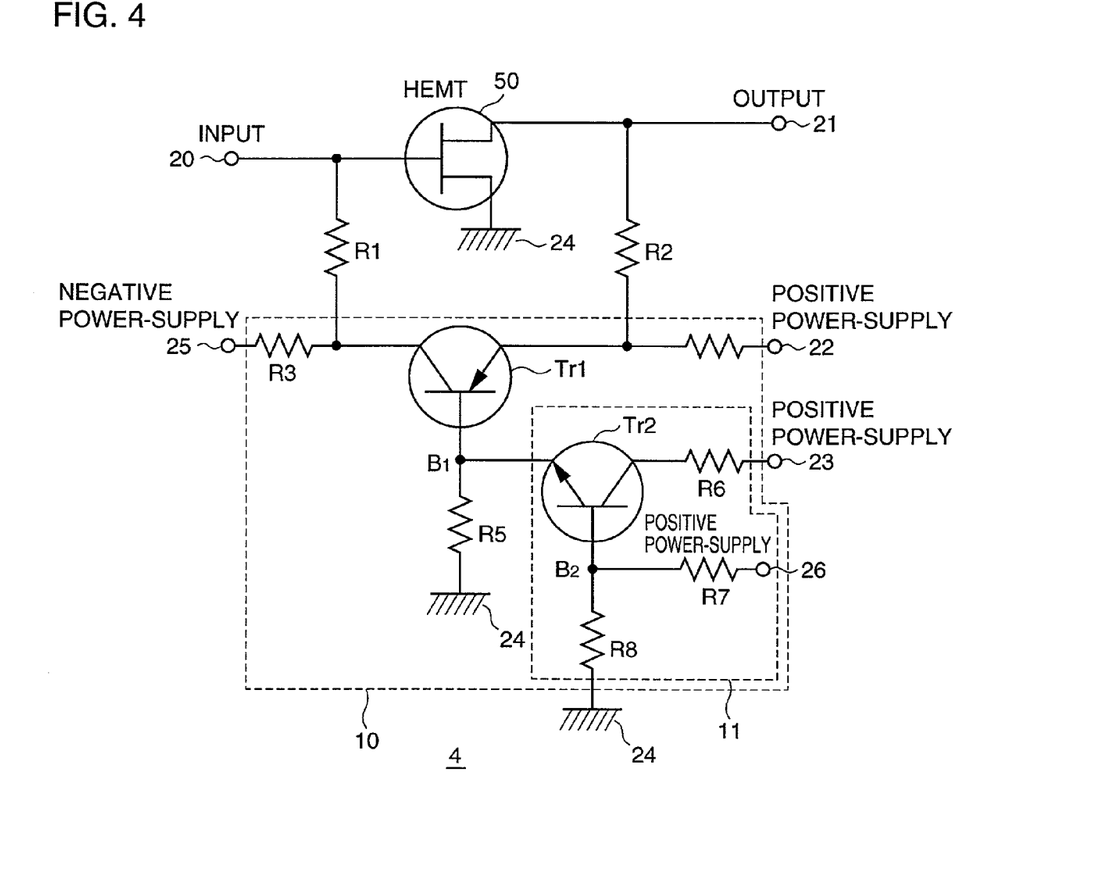
FIG. 4 is a circuit diagram showing an example of the MIX shown in FIG. 3.

FIG. 4 is a circuit diagram showing the configuration of MIX 4 according to the first embodiment.

Here, an NPN bipolar transistor is added as temperature characteristic compensating circuit 11 in FIG. 3. Temperature characteristic compensating circuit 11 includes an NPN bipolar transistor Tr2, and resistance elements R6, R7 and R8.

Resistance element R6 is connected between positive power-supply node 23 and the collector of transistor Tr2. Resistance element R7 is connected between a positive power-supply node 26 and the base of transistor Tr2. Resistance element R8 is connected between the base of transistor Tr2 and ground node 24. The emitter of transistor Tr2 is connected to the base of transistor Tr1.

Next, the operation of MIX 4 shown in FIG. 4 will be described.

In FIG. 4, collector current of transistor Tr1 is determined in accordance with a voltage at a B1 point, which is a connecting point of the base of transistor Tr1 and resistance element R5. Further, a drain voltage of HEMT 50 is determined by the collector current of transistor Tr1.

Whereas, the voltage at the B1 point is determined in accordance with the collector current of transistor Tr2 determined by a voltage at a B2 point, which is a connecting point of transistor Tr2 and resistance element R7.

A case where a temperature change is applied to driving circuit 10 is now considered. When the ambient temperature of transistor Tr1 is raised, the voltage between the base and emitter of transistor Tr1 indicates a negative temperature dependency, and thus the collector current of transistor Tr1 is increased in accordance with the temperature characteristic. Therefore, the increase in the collector current of transistor Tr1 affects the drain voltage of HEMT 50 such that the drain voltage is lowered.

Then, as in the case with transistor Tr1, the ambient temperature is also raised in transistor Tr2. The voltage between the base and emitter of transistor Tr2 indicates a negative temperature dependency as in the case with transistor Tr1. Thus, the collector current of transistor Tr2 is also increased. The increase of the collector current of transistor Tr2 raises the voltage at the B1 point. The raise of the voltage at the B1 point means lowering of the voltage between the base and emitter of transistor Tr1, and affects the collector current of Tr1 such that the collector current is reduced. Therefore, the raise of the collector current of transistor Tr1 due to the temperature raise is suppressed, and, as a result, the drain voltage of HEMT 50 is stabilized even though the ambient temperature is raised.

As described above, by connecting transistor Tr2, as a compensating circuit for the temperature characteristic, having an opposite polarity structure to that of transistor Tr1 to transistor Tr1 as a driving circuit supplying a stable voltage to HEMT 1, variation in the drain voltage of HEMT 50 due to temperature can be lessened.

Second Embodiment

Though an embodiment of the present invention has been described, the invention is not limited to the embodiment described above, and can be implemented in other forms.

Figure 5:
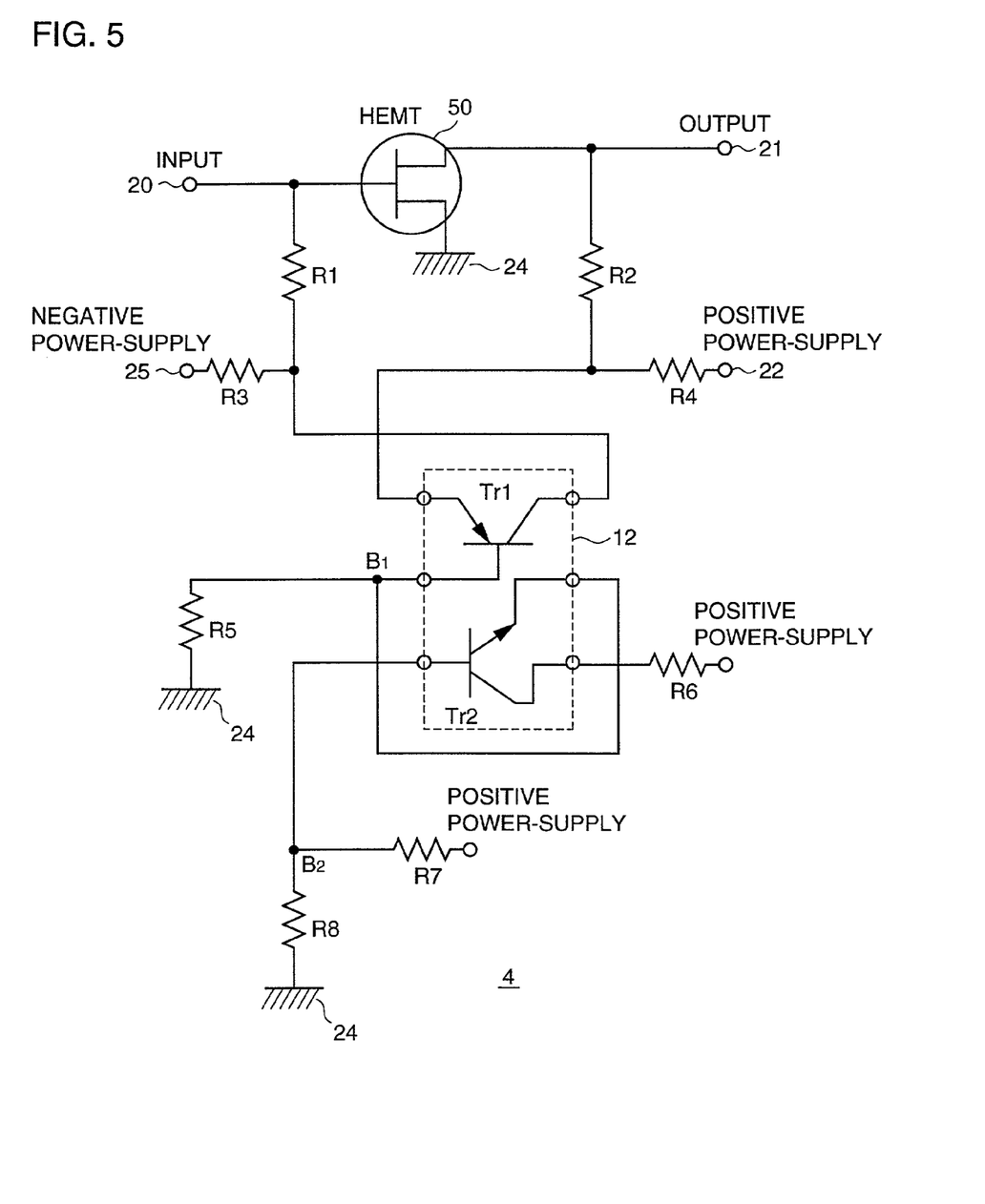
FIG. 5 is a circuit diagram showing another example of the MIX shown in FIG. 3.

FIG. 5 is a circuit diagram showing another example of MIX 4 within LNB 102.

This MIX 4 uses a dual transistor 12 in which transistor Tr1 and transistor Tr2 are packaged together, in place of transistor Tr1 and transistor Tr2 being installed as independent elements as shown in FIG. 4.

The operation of MIX 4 with respect to a change in the ambient temperature is similar to that in the first embodiment, and dual transistor 12 stabilizes the drain voltage of HEMT 50 with respect to the change of the ambient temperature.

By packaging transistor Tr1 and transistor Tr2 together to form dual transistor 12, the temperature condition comes to be the same for each of transistors Tr1, Tr2, and therefore variation with respect to the temperature change is suppressed and more stable voltage can be supplied to HEMT 50.

Furthermore, the area occupied by the transistor within the circuit can be reduced by the packaging technique, and thus weight reduction of devices can be achieved due to the saving in space.

EXAMPLE

Figure 6:
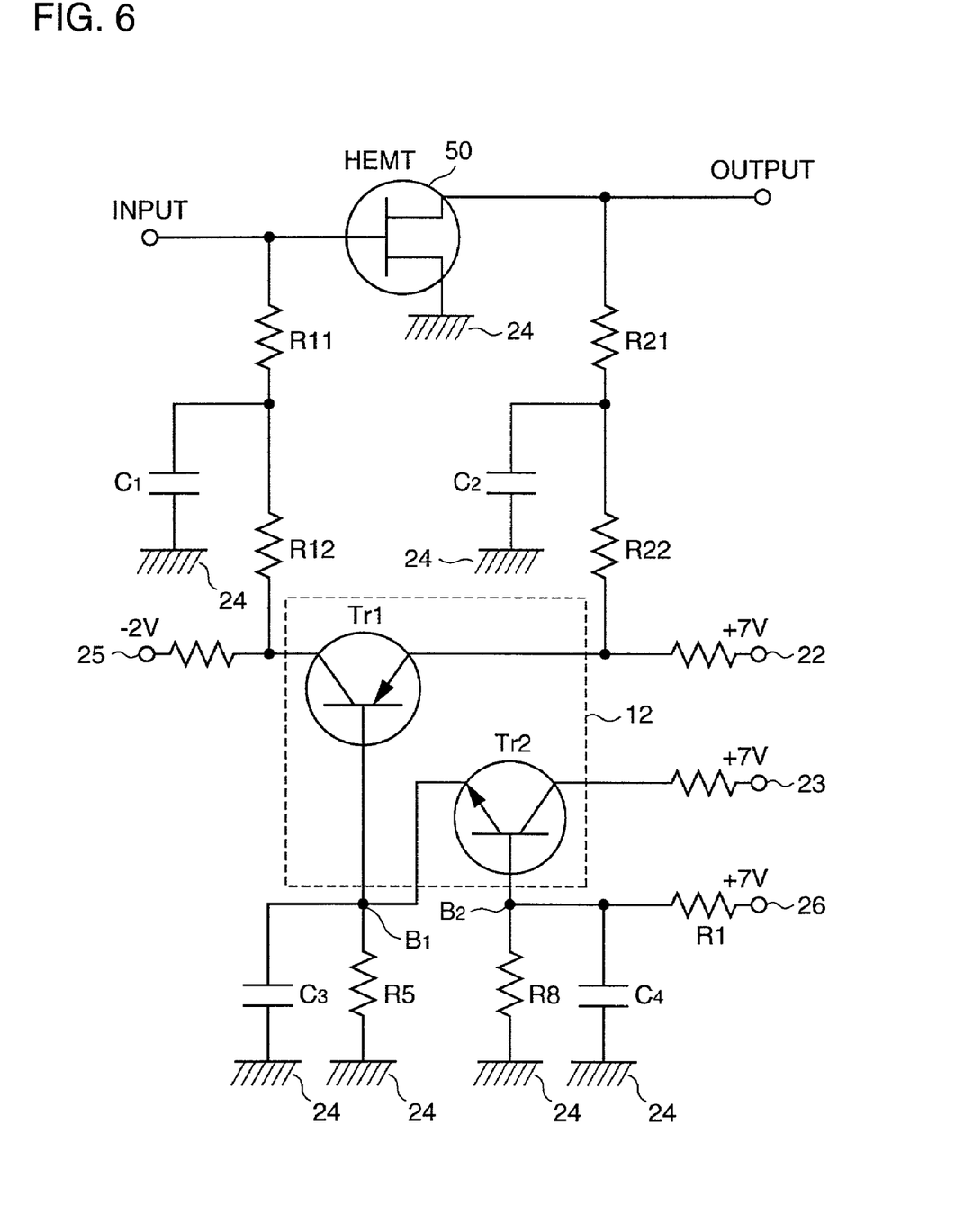
FIG. 6 is a circuit diagram showing the configuration of an MIX according to an example of the present invention used for the measurement of a drain voltage.

FIG. 6 is a circuit diagram showing the configuration of the MIX of the present invention when a change in the drain voltage of HEMT 50 with respect to a change in the temperature is measured.

For the driving circuit, dual transistor 12 in which transistor Tr1 and transistor Tr2 are packaged together is used.

Resistance element R1 in FIG. 5 is, in FIG. 6, constituted by resistance elements R11, R12, and a bypass capacitor C1 connected in series. Similarly, in FIG. 6, resistance element R2 in FIG. 5 is constituted by resistance elements R21, R22, and a bypass capacitor C2 connected in series.

Furthermore, in FIG. 6, a bypass capacitor C3 is connected between the base of transistor Tr1 and ground node 24, and a bypass capacitor C4 is connected between the base of transistor Tr2 and ground node 24.

Figure 7:
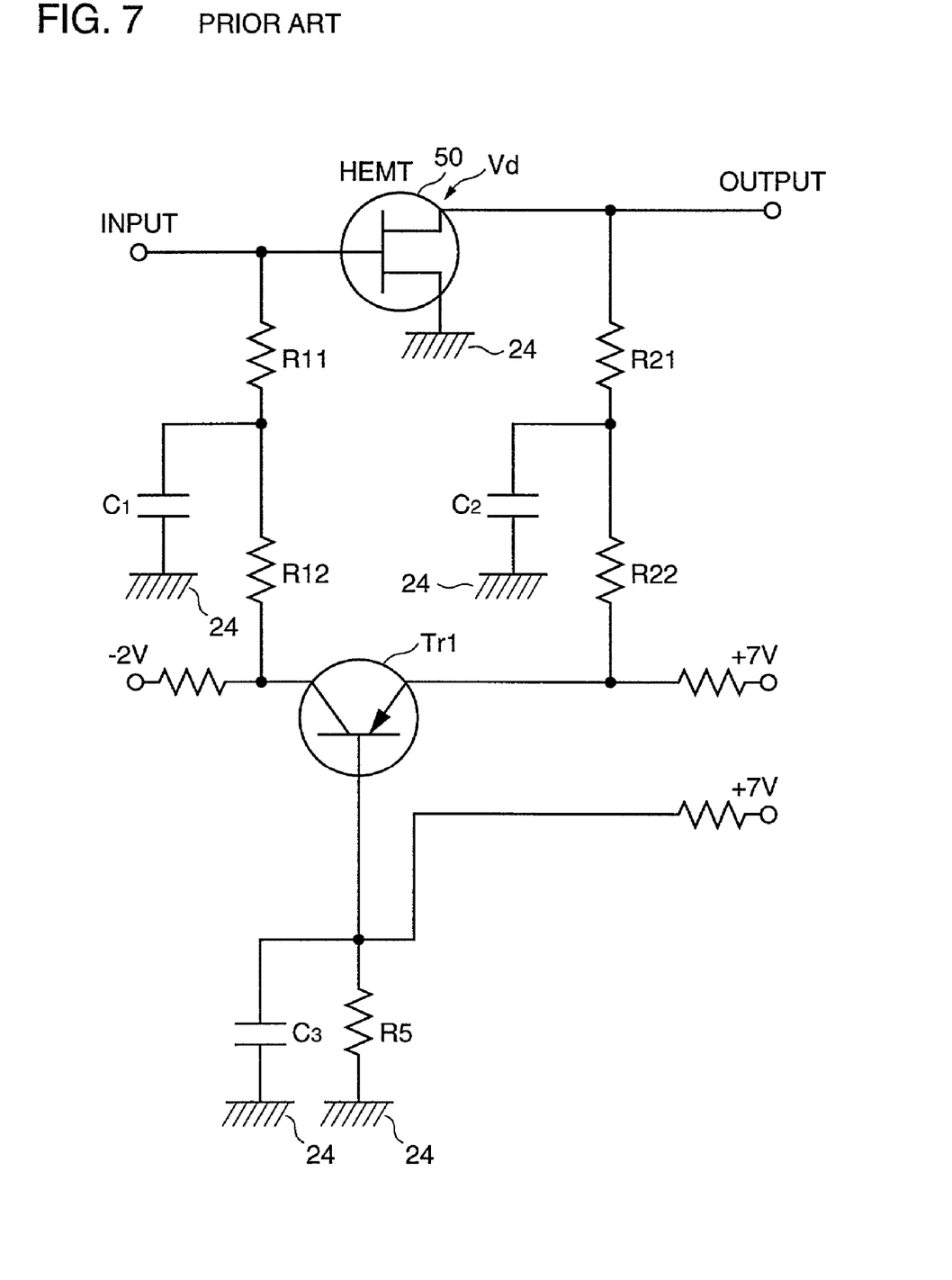
FIG. 7 is a circuit diagram showing the configuration of the conventional MIX used for the measurement of a drain voltage.

As a comparative example, FIG. 7 shows a circuit configuration of the conventional MIX when a change in the drain voltage of HEMT 50 is measured with respect to a change in the temperature.

A positive power-supply is set as 7 volts and a negative power-supply is set as −2 volts, and the changes in the drain voltage of HEMT 50 were measured in the conventional MIX and in the MIX of the present invention at the ambient temperatures of −30° C., 25° C. and 50° C.

As for the MIX to be measured, two circuits having an identical structure were fabricated for the conventional MIX and named as the first conventional circuit and the second conventional circuit, and similarly, two circuits having an identical structure were fabricated also for the MIX of the present invention and named as the first invention circuit and the second invention circuit.

Figure 8A:
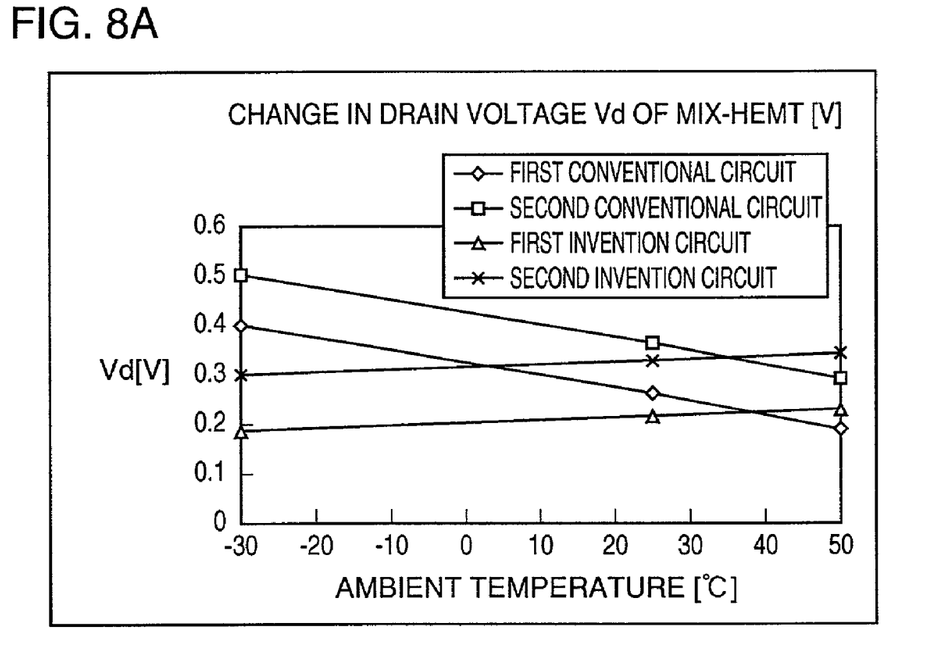
FIGS. 8A and 8B show measurement results of the drain voltage.
Figure 8B:
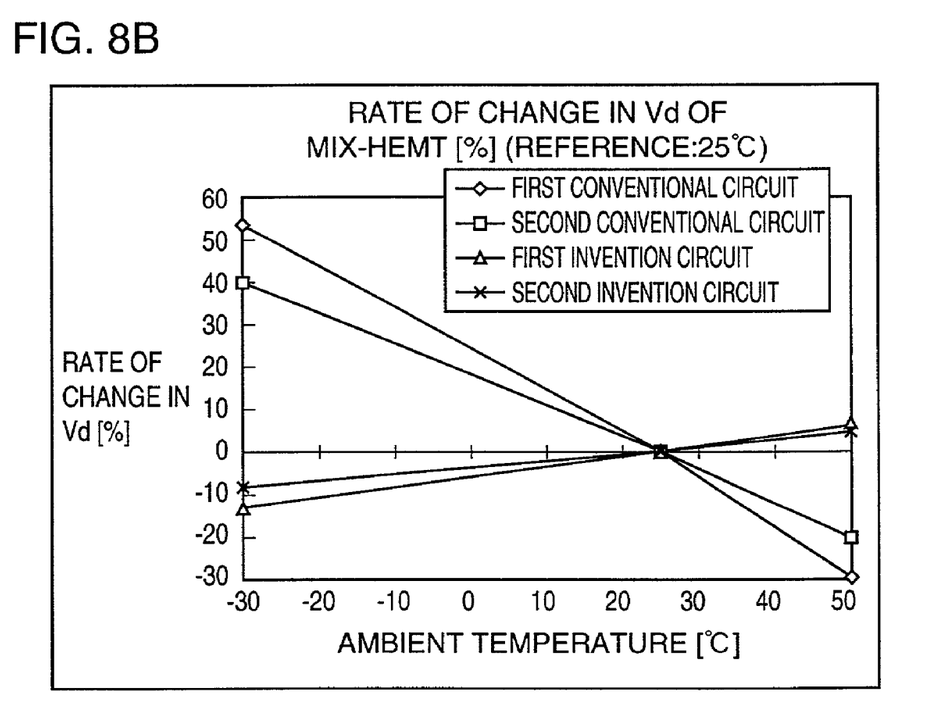

The measurement result of drain voltage Vd value (V) of HEMT 50 at each ambient temperature is indicated in Table 1, and the chart illustrating the result is shown in FIG. 8A. Moreover, the rate of change (%) in the drain voltage of HEMT 50 at each ambient temperature is indicated in Table 2 using the value of the drain voltage of HEMT 50 at the ambient temperature of 25° C. as a reference, and the chart illustrating thereof is shown in FIG. 8B.

TABLE 1

Change in Drain Voltage Vd of MIX-HEMT [V]

| Ambient Temperature [° C.] | 1st Conventional Circuit | 2nd Conventional Circuit | 1st Invention Circuit | 2nd Invention Circuit |
|---|---|---|---|---|
| −30 | 0.4 | 0.503 | 0.185 | 0.299 |
| 25 | 0.261 | 0.361 | 0.213 | 0.326 |
| 50 | 0.183 | 0.287 | 0.226 | 0.34 |

TABLE 2

Rate of Change in Vd of MIX-HEMT [%] (Reference: 25° C.)

| Ambient Temperature | 1st Conventional Circuit | 2nd Conventional Circuit | 1st Invention Circuit | 2nd Invention Circuit |
|---|---|---|---|---|
| −30 | 53.25670498 | 39.33518006 | −13.1455399 | −8.28220859 |
| 25 | 0 | 0 | 0 | 0 |
| 50 | −29.8850575 | −20.498615 | 6.103286385 | 4.294478528 |

As a result of the measurements, the change in the drain voltage of HEMT 50 with respect to the change in the ambient temperature is smaller in the MIX of the present invention.

Therefore, provision of transistor Tr2 as a temperature compensating circuit allows variation in the collector current of transistor Tr1 to be suppressed, and therefore, variation in the drain voltage of HEMT 50 can be suppressed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A low noise down converter for satellite broadcast receiving, comprising a mixer converting a received high-frequency signal into an intermediate-frequency signal,
said mixer including:
a transistor performing frequency conversion,
a first bipolar transistor having an emitter connected to a drain of said transistor and a collector connected to a gate of said transistor,
a temperature characteristic compensating circuit connected to a base of said first bipolar transistor and stabilizing a temperature characteristic of said first bipolar transistor; and
a resistor circuit configured to adjust a rate of temperature change of a collector current of said first bipolar transistor;
wherein said temperature characteristic compensating circuit includes a second bipolar transistor having a conductive terminal connected to the base of said first bipolar transistor, and
said resistor circuit includes a first resistance element for adjusting the collector current of said first bipolar transistor, and a second resistance element for adjusting a collector current of said second bipolar transistor.

2. The low noise down converter according to claim 1, wherein
said temperature characteristic compensating circuit is configured to lessen a variation of said collector current of said first bipolar transistor in accordance with said temperature characteristic by adjusting a DC voltage applied to said base of said first bipolar transistor according to an ambient temperature.

3. The low noise down converter according to claim 1, wherein the first bipolar transistors is a PNP transistor, the second bipolar transistor is a NPN transistor, and the PNP and NPN bipolar transistors are packaged into a dual transistor.

4. A mixer comprising:
a transistor performing frequency conversion of a received signal;
a first bipolar transistor having an emitter connected to a drain of said transistor and a collector connected to a gate of said transistor;
a temperature characteristic compensating circuit for stabilizing a temperature characteristic of the first bipolar transistor, the temperature characteristic compensating circuit including a second bipolar transistor having a conductive terminal connected to a base of said first bipolar transistor; and a resistor circuit configured to adjust a rate of temperature change of a collector current of said first bipolar transistor, said resistor circuit including
a first resistance element for adjusting the collector current of said first bipolar transistor, and
a second resistance element for adjusting a collector current of said second bipolar transistor.

5. The mixer according to claim 4, wherein
said temperature characteristic compensating circuit is configured to maintain said collector current of said first bipolar transistor irrespective of an ambient temperature by adjusting a DC voltage applied to said base of said first bipolar transistor according to said ambient temperature.

6. The mixer according to claim 4, wherein the first bipolar transistor is a PNP transistor, the second bipolar transistor is a NPN transistor, and the PNP and NPN bipolar transistors are packaged into a dual transistor.

* * * * *